United States Patent [19]
Rudy, Jr. et al.

[11] Patent Number: 5,348,482
[45] Date of Patent: Sep. 20, 1994

[54] HIGH DENSITY INTEGRATED BACKPLANE ASSEMBLY

[75] Inventors: William J. Rudy, Jr., Annville; Howard R. Shaffer, Millersburg; Daniel E. Stahl, Hummelstown, all of Pa.

[73] Assignee: The Whitaker Corporation, Wilmington, Del.

[21] Appl. No.: 76,656

[22] Filed: Jun. 11, 1993

[51] Int. Cl.$^5$ .............................................. H05K 5/02
[52] U.S. Cl. ......................................... 439/61; 439/77
[58] Field of Search ...................... 493/61, 62, 64, 77, 493/78, 79, 540, 59

[56] References Cited

U.S. PATENT DOCUMENTS

| | | | |
|---|---|---|---|
| 3,970,802 | 7/1976 | Nijman | 439/77 X |
| 4,143,932 | 3/1979 | Boutros | 439/77 X |
| 4,550,960 | 11/1985 | Asick et al. | 439/61 |
| 4,582,374 | 4/1986 | Conrad et al. | 439/61 |
| 4,735,583 | 4/1988 | Rudy, Jr. et al. | 439/350 |
| 4,790,762 | 12/1988 | Harms et al. | 439/62 X |
| 4,808,115 | 2/1989 | Norton et al. | 439/79 |
| 4,846,699 | 7/1989 | Glover et al. | 439/64 |
| 4,953,058 | 8/1990 | Harris | 361/383 |
| 4,995,821 | 2/1991 | Casey | 439/157 |
| 4,997,377 | 3/1991 | Goto et al. | 439/68 |
| 5,065,280 | 11/1991 | Karnezos et al. | 361/386 |
| 5,265,322 | 11/1993 | Fisher et al. | 29/848 |

OTHER PUBLICATIONS

Minco Bulletin FC-301, "Flex-Circuits", eight pages, Apr., 1991; Minco Products, Inc., Minneapolis, Minn.
Tyco Pamphlet, "Tyco Pinted Circuit Group", thirteen pages, Tyco Laboratories, Inc., Stafford, Conn.

*Primary Examiner*—Z. R. Bilinsky
*Attorney, Agent, or Firm*—Anton P. Ness

[57] ABSTRACT

A backplane assembly (200) for a compact card cage such as a junction box (10) having a forward wall section (202) and a rearward wall section (14) with interconnection circuitry (206) disposed therebetween. Struts (216) join forward and rearward wall sections and the backplane assembly is manipulatable as a unit. Interconnection circuitry (206) can be a laminar assembly of flexible circuit elements (230) with terminals (220) of daughter card-matable connectors (204) of the forward wall terminated to circuits thereof at a first connection region $CR_1$ and terminals (212) of input/output connectors (208) terminated at a second connection region $CR_2$. All circuits from second region $CR_2$ can be directed to an integration region $CR_M$ part of first region $CR_1$ and selected circuits can be directed to terminals of daughter card-matable connectors elsewhere in first region $CR_1$ connected by a programmable integration member (130).

7 Claims, 13 Drawing Sheets

HIGH DENSITY INTEGRATED BACKPLANE ASSEMBLY

FIELD OF THE INVENTION

The present invention relates to backplanes for electrical interconnections circuits of daughter card arrays to conductors of electrical cables.

BACKGROUND OF THE INVENTION

Card cages are known, in which a framework is provided to define a card receiving region in which pairs of card guides establish locations for insertion of daughter cards therealong, for connectors mounted at a leading edge of each thereof to mate with corresponding connectors of a backplane traversing the rear of the card receiving region. The backplane provides for electrical connections of the circuits of each daughter card inserted to circuits of other daughter cards as desired or to conductors of input/output cable. One such card cage is disclosed in U.S. Pat. No. 4,846,699 directed to a system for providing electrical power to the components mounted on the daughter cards.

A backplane is disclosed in U.S. Pat. No. 4,582,374 which interconnects a high density of signal circuits of cards mountable along a front face thereof with corresponding circuits along a back face thereof, as well as providing power interconnections and ground.

Another particular form of card cage is disclosed in U.S. Pat. No. 4,808,115 in which circuit cards mounted within modules are insertable into an enclosure or box commonly referred to as a black box and containing a mother board to which the circuit cards are interconnected. The modules are referred to as line replaceable modules.

Aircraft have a great many electrical circuits interconnecting a variety of electrical articles thereon such as black boxes, sensors, instrument panels and the like, and the circuits are commonly interconnected in regions termed electronics bays. Various arrangements have been devised to provide for disconnectable interconnections of the circuits and are known as wire integration systems. Two such systems are disclosed in U.S. Pat. Nos. 4,735,583 and 4,995,821. Discrete wire conductors are used to define the interconnections.

SUMMARY OF THE INVENTIONS

The present invention provides an enclosure for an array of individual circuit boards or daughter cards, a backplane assembly to which the circuit boards are electrically connectable and disconnectable, and an input/output interface for electrically connecting the backplane to cables of discrete electrical conductors, all thus defining a junction box. The junction box includes a front panel traversing the front face which is adapted to be removable from the enclosure, a pair of opposing side walls, upper and lower walls which include opposed pairs of card-guiding channels extending rearwardly from the front face, a backplane assembly traversing the rearward region of the enclosure, and a rear wall which completes the enclosure and provides for electrical connections of cables to the backplane assembly. The junction box defines an integral rugged electrically and thermally conductive envelope surrounding the backplane assembly and daughter cards which provides protection against electromagnetic interference (EMI) and radiofrequency interference (RFI) to assure the integrity of signals received, processed and transmitted by the electronic circuitry and components therewithin. The junction box also provides heat dissipation for the components therewithin which have been isolated from the otherwise cooling effect of ambient air flow usually relied upon to remove thermal energy from electronics bays.

The junction box is mountable to a shelf or other frame structure as is conventional, in a manner similar to that used for securing black boxes in electronics bays of aircraft, and using a rack similar to conventional racks. Used in association with the junction box is a rugged frame mounted to the rack just rearwardly of the junction box on which are mounted connectors terminating the cables to be electrically connected to the backplane assembly within the junction box. Mating faces of the cable connectors face forwardly to mate with corresponding mating faces of cable-associated connectors of the backplane assembly exposed along the rear wall and facing rearwardly. During typical mounting of the junction box into its in-service location, the cables will already be installed in position within the aircraft with the cable connectors secured to the rugged frame mounted to the rack. The junction box is then positioned on the rack and urged rearwardly to its installed location, with the cable-associated connectors defined on the rear wall mate with the cable connectors float-mounted to the rugged frame, in a blind mating or rack-and-panel arrangement. Preferably a large diameter pin extends forwardly from the frame to be received into a corresponding hole of the rear wall of the junction box, cooperating to enhance resistance to vibration and to wear. The junction box is then secured in position by cooperation of locking mechanisms secured to the rack with complementary lock embossments on the bottom surface of the lower wall at the front face. Electrically conductive gaskets surround every opening in the junction box to provide an EMI/RFI seal at each possible incremental gap during in-service use, including the periphery of the front panel and the periphery of the mating faces of the cable-associated connector along the rear wall.

The front panel is securable to and removable from the junction box in its installed condition, thus enabling insertion and removal of individual daughter cards from the junction box as desired and without requiring removal of the junction box from its installed position. Preferably the front panel includes a pair of handles facilitating manipulation thereof. With the front panel removed, each daughter card in a vertical orientation can be moved along an associated pair of opposed guide channels extending rearwardly from the front face to the forward face of the backplane assembly, and then clamped in the fully inserted position all in a manner similar to conventional card cages. The front panel includes an array of fins along the exterior surface for dissipating thermal energy transmitted from the interior during in-service use, by increasing the surface area exposed to ambient air currents surrounding the junction box. Along the interior surface of the front panel is an array of fins at least including one associated with the edge of each daughter card proximate the front face after insertion, and preferably each interior fin includes a ground clip mounted along the leading edge thereof to become firmly engaged with the adjacent edge of the associated daughter card to establish a ground connection and a thermal connection with an electrically and thermally conductive layer of the daughter card to establish an enhanced heat-removal mechanism as well as a means for minimizing crosstalk between components of the various daughter cards. Such ground clips mounted along the interior fins are adapted to mate simultaneously with the front edges of all the respective daughter cards in a blind mate manner.

The backplane assembly includes a forward face associated with the daughter cards, and a rearward face associated with the cables. Preferably the rearward face is defined by the rear wall of the junction box, and the forward face is defined by a rugged interior panel member mounted within the junction box. The forward face contains an array of daughter card-associated electrical connectors facing forwardly to be matable with complementary connectors mounted on rear edges of the daughter cards, and appropriately positioned with respect to the card-guiding channels to become mated upon insertion of the daughter cards, with the daughter card-associated connectors mounted within apertures of the interior panel. Preferably the card-associated connectors are mounted in a manner permitting incremental adjustment in the plane of the panel to precisely self-align the front contact sections of the arrays of electrical contacts with contact sections of corresponding arrays of complementary contacts of the card edge connectors mounted on the daughter cards for remote mating during daughter card insertion, enabling mating of the individual pairs of mating contacts.

The rear contact sections of the electrical contacts of the daughter card-associated connectors are electrically connected to respective termini of circuit paths of a circuit-bearing element which extend to opposed termini electrically connected to rear contact sections of corresponding electrical contacts of cable-associated connectors mounted in the rear junction box wall. Front contact sections of the corresponding contacts are exposed for mating with complementary contact sections of the contacts in the cable connectors secured in cutouts through the rear frame. The backplane assembly thus electrically interconnects respective circuits or wires of the cables with appropriate circuits of the daughter cards.

The junction box of the present invention and the backplane assembly also are especially useful to define a wire integration system, in which circuits of the daughter cards can be connected as desired to any particular conductor of the input/output interface. A discrete member such as a circuit card insertable into the card cage, is disclosed which selectively interconnects the circuits through the interconnection circuitry of the backplane assembly. Such a discrete member, or matrix card, can be programmed and reprogrammed easily, with no changes being made which involve specific use customization or modification to the backplane assembly, and which greatly simplifies backplane construction for a high density of thousands of individual circuits.

The rear wall includes integral shrouds surrounding the mating faces of the cable-associated connectors which interfit with complementary shrouds of the cable connectors in a conventional plug/receptacle manner, and EMI/RFI ground members are mounted peripherally around the plug shrouds to establish a ground connection with the interior surface of the receptacle shrouds thus grounding the cable shields to the junction box and also assuring no EMI/RFI gap surrounding the mating faces of the connectors in the mated condition, and adapted to maintain such ground connection during mechanical vibration during in-service use. Preferably the cable connectors are mounted in apertures of the rugged frame in a manner permitting incremental lateral movement during mating upon initiation of the interfitting of the plug shrouds with the receptacle shrouds to precisely align the arrays of mating contact sections of the mating connectors, all as the junction box is being urged into its in-service position in the rack.

Backshells are easily mounted to the cable connectors and enclose the lengths of discrete conductor wires extending from each cable for EMI/RFI protection, and include integral flanges to which the shielding braids of each cable are affixed for grounding thereof; and the backshells are adapted to be clamped to the cable outer insulative jackets to provide strain relief for the cable connectors. Each backshell may be an integral four-sided member first placed loosely onto the cable prior to terminating the conductors thereof to respective terminals and securing the terminals into the housings of the cable connectors, and then moved against the cable connectors and mounted thereto before securing the loaded connectors into respective apertures, and then securing the shielding braid about the backshell flange. In a second embodiment, a backshell may also be assembled about the connector after conductor termination and securing the connector to the frame, in which case the backshell may later be opened to repair or replace a terminal without first requiring total connector removal, and also permitting the drain wires to be grounded to the backshell.

Preferably the circuit-bearing element is defined by an array of overlaid layers of thin flexible circuit elements or films permitting substantial latitude in the routing of the discrete circuits. Such an arrangement permits the termini connected to the card-associated connectors to be defined in a plurality of first high density three-dimensional arrays at a central region of the films adjacent the rearward surface of the interior panel and associated with respective ones of the card-associated connectors; the circuits then extend laterally within the various layers of flexible elements to intermediate regions laterally of the first arrays to outer regions containing the second arrays thereof; the intermediate regions enable the circuit-bearing element to define gentle 180° bends for outer regions to be doubled back to be parallel to and adjacent the rear wall with the circuits concluding in termini defined in a plurality of high density three-dimensional arrays independent of the first arrays for electrical connection to the contacts of the cable-associated connectors. The backplane assembly can be fabricated as a subassembly with the interior panel and rear wall mounted to a plurality of posts about the peripheries thereof, with the circuit-bearing element mounted therebetween already electrically interconnecting the associated contact members of the cable-associated connectors and card-associated connectors. The plurality of posts preferably are guide members insertable into and along opposed pairs of channels defined at least along the interior surfaces of the upper and lower walls of the junction box extending forwardly from rear edges thereof, all positioned to align the card-associated connectors with the appropriate card-guiding channels. Fabrication of the backplane assembly can be accomplished by mounting the card-associated connectors to the interior panel, joining the rear contact sections of the contacts mounted in the dielectric housings thereof to appropriate termini of the flexible film circuits and joining the opposed termini to appropriate contact sections of contacts of the cable-associated connectors, and then securing the cable-associated connectors to the rear wall. Preferably all of the film layers include pin-receiving holes at all locations aligned with all electrical contacts of all of the cable-associated and card-associated connectors, with the circuit traces extending to termini for the associated contact and isolated from all other pin-receiving holes and with the traces except at the termini being disposed between two layers of dielectric material, as is conventional in flexible films.

One such process involves a layer-by-layer evolution by placing the first or outermost film over the pin contact sections of all of the connectors to extend through the respective holes, and joining selected termini defined on the first film layer to the appropriate contacts of the cable-associated connectors and card-associated connectors; placing the second film layer over the first layer with pin contact sections through the holes and connecting its termini to corresponding contacts; and continuing until all layers are thus connected. Each film layer is adapted to achieve the ultimate 180° bends to each side of the circuit-bearing element by having incrementally different lateral lengths of the intermediate regions of the films between the first and second arrays, with the first or outermost layer having the greatest lateral length and the last or innermost layer having the least. As the layers are carefully built up, the incremental difference in intermediate region lengths results in inherent bends of the multilayer structure to each side.

Alternatively, the layers may be initially stacked with the hole arrays aligned at the card-associated region at the center of the films, and the layers firmly adhered together at the center such as by clamping and potting along the periphery; the holes are then plated in a process akin to multi-layer printed circuit board fabrication, in which the plating material extends along the aligned holes between the two outermost layers, but with a conductive connection only with the trace of the terminus of the particular layer with which an electrical connection to a connector pin is ultimately desired while plating material engages only dielectric material of the other layers adjacent the respective hole. Then upon insertion of pins through all such plated holes and soldering of the pin end to the plating material at the exposed outer layer, the pin is conductively connected to the desired terminus. Connection of the cable-associated hole arrays can be performed similarly with the plural layers formed about 180° and then adhered at the ends after the hole arrays are aligned and then plated and soldered, or as described in the first process.

Preferably each daughter card rear edge includes connectors mounted thereto to be disposed in large cavities of an integral rugged conductive shell member mounted to the daughter card rear edge. The integral shell includes a card-mounting post by conventional mounting hardware at each end and a centrally located mounting post which is precisely positioned with respect to the termini arrays of the circuits of the daughter card and thus defines a datum or reference for the electrical contacts contained in the dielectric housings of the daughter card connectors. This arrangement assures that the contacts already assembled within respective passageways of the housings prior to being electrically connected to the respective termini, are inherently precisely positioned by the housings within the large cavities of the integral shell. This arrangement also enables use of standard card-edge mountable connectors. The integral shell further includes a forwardmost face which is adapted to initially engage leading edges of the card-associated connectors mounted in the interior panel of the backplane assembly and incrementally laterally adjust the position thereof to precisely align the contacts therein with the associated contacts of the daughter card connectors for blind mating. Also the integral shell may have key members complementary with keys affixed to the interior panel so that only the appropriate daughter card is physically able to be fully inserted into the selected card location defined by the card-guiding channels for its connectors to mate with the card-associated connectors. Such integral shells also assist in minimizing crosstalk between unrelated circuits and components within the junction box, and are electrically and thermally connected to the metal layer of each of the daughter cards, which are electrically and thermally connected to the front panel of the junction box for grounding and heat dissipation.

In addition to the array of daughter cards containing electronic components mounted thereon including for example microprocessors and integrated circuits, the junction box includes a matrix card which is insertable into a particular card location and includes arrays of pin contacts extending from both surfaces thereof joined to discrete circuits thereof. The pin contacts enable interconnection to others thereof by jumper wires defining a circuit integration system, and enable customizing or programming the particular junction box to serve a particular purpose in a manner permitting and facilitating reprogramming later if desired. Such a matrix card can include daughter card connectors along the rear edge on both surfaces thereof for connection of their contacts to circuits along both major surfaces thereof. With no electronic components thereon and thus minimal heat generation, no metal layer is needed on a major surface of the matrix card for heat dissipation to the front junction box panel.

It is an objective of the present invention to provide a backplane assembly which is rugged for resistance to mating and unmating of its connectors with daughter card connectors upon insertion and removal of the daughter cards, while providing high density interconnections with a substantial plurality of conductors of the input/output connectors electrically connected to cable connectors.

It is another objective to provide a backplane assembly which permits interconnection of contacts of a plurality of card-associated connectors to corresponding contacts of a plurality of cable-associated connectors, independent of axial alignment of the contact arrays, or contact spacing, and permitting circuits of different current-carrying capacity.

It is an additional objective to provide a backplane assembly wherein circuit integration among the circuits of the daughter cards is provided by a dedicated daughter or matrix card, thus enabling all programming of the circuits within the junction box to be defined on the matrix card which is easily insertable into and removable from the junction box which facilitates reprogramming if desired.

An embodiment of the present invention will now be described by way of example with reference to the accompanying drawings.

DETAILED DESCRIPTION OF THE PREFERRED EMBODIMENT

Figure 1:
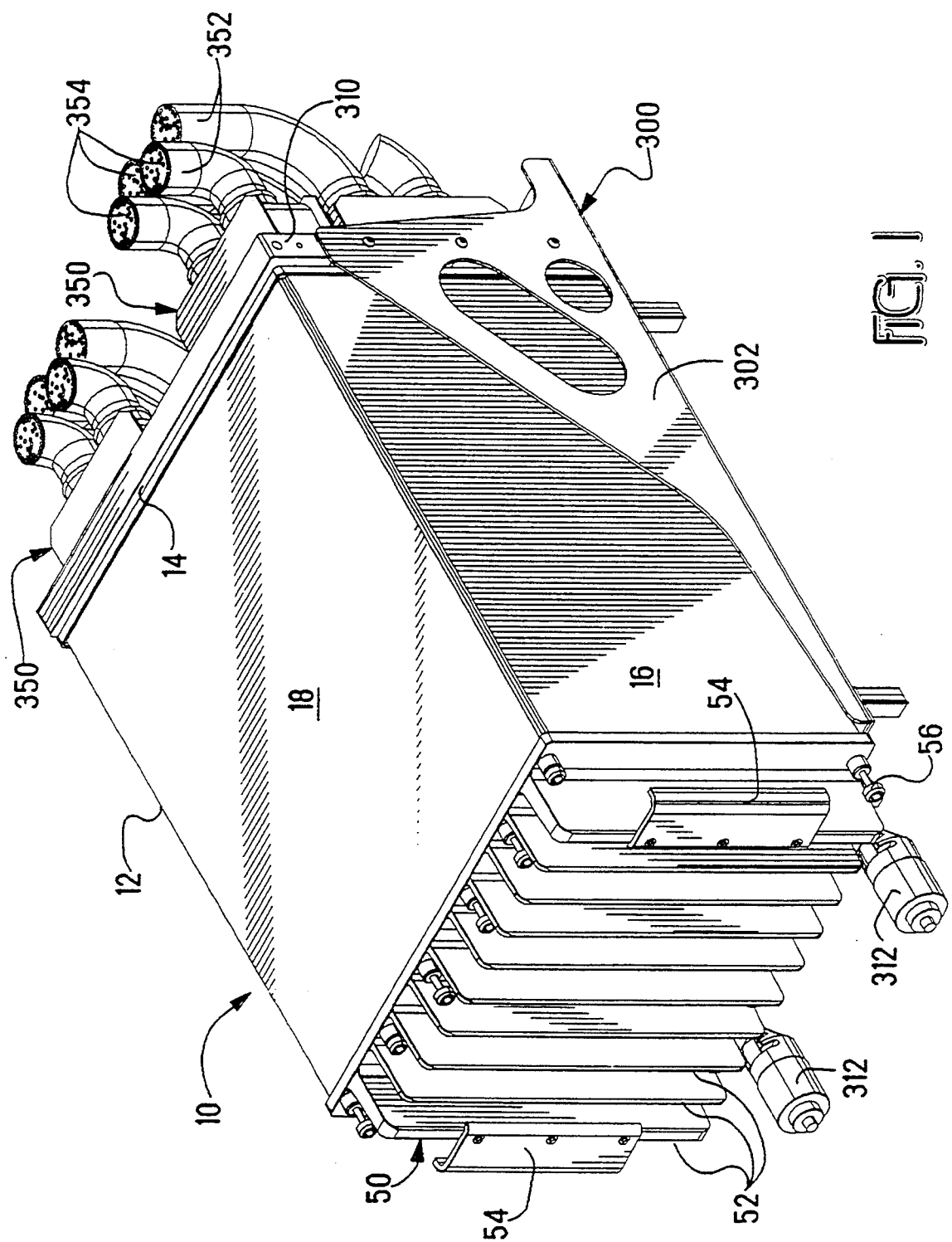
FIG. 1 is an isometric view of the junction box in which the present invention may be used, secured in position within a rack assembly.
Figure 2:
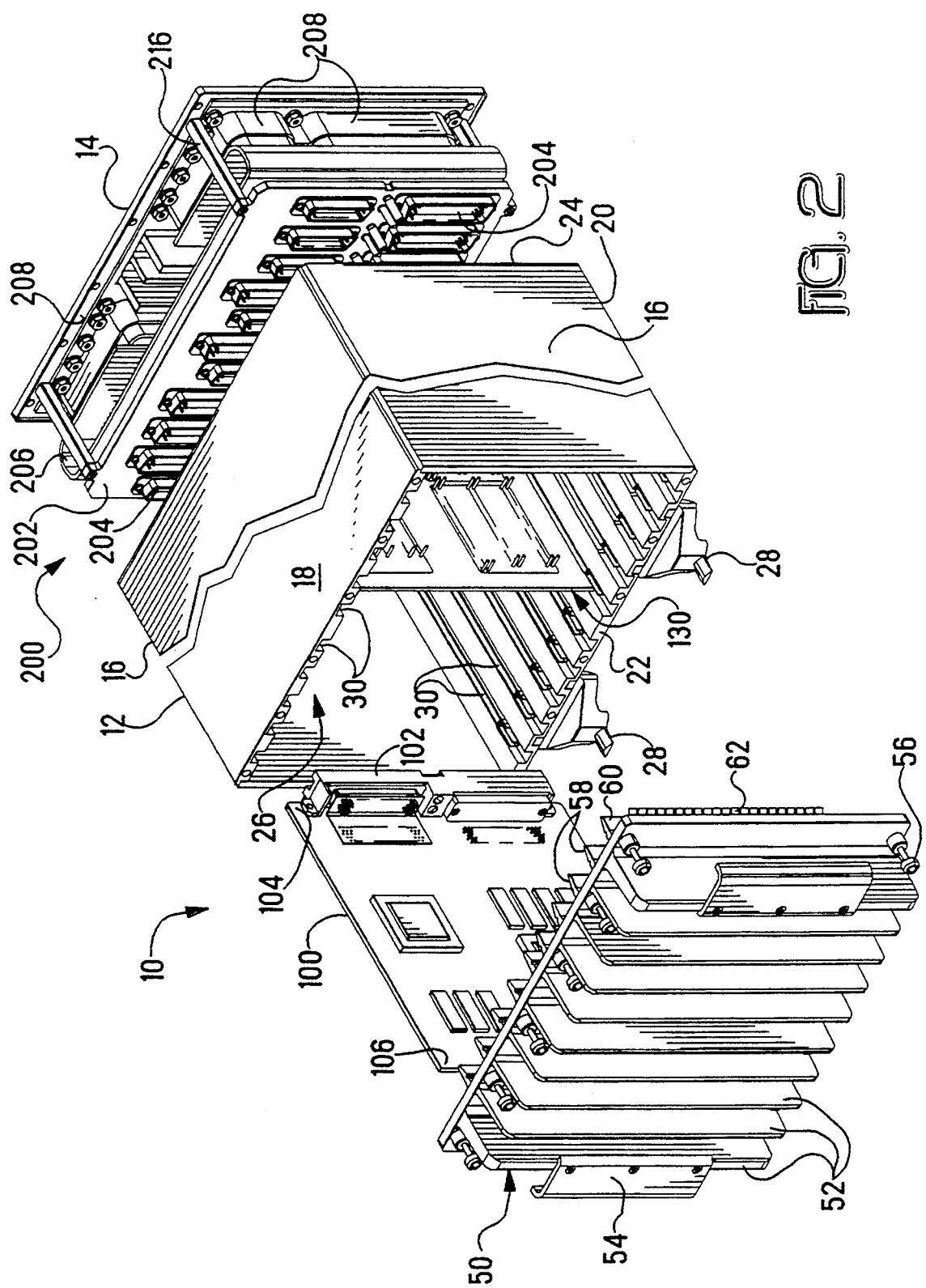
FIG. 2 is an exploded isometric view of the junction box of FIG. 1, showing the backplane assembly of the present invention.
Figure 3:
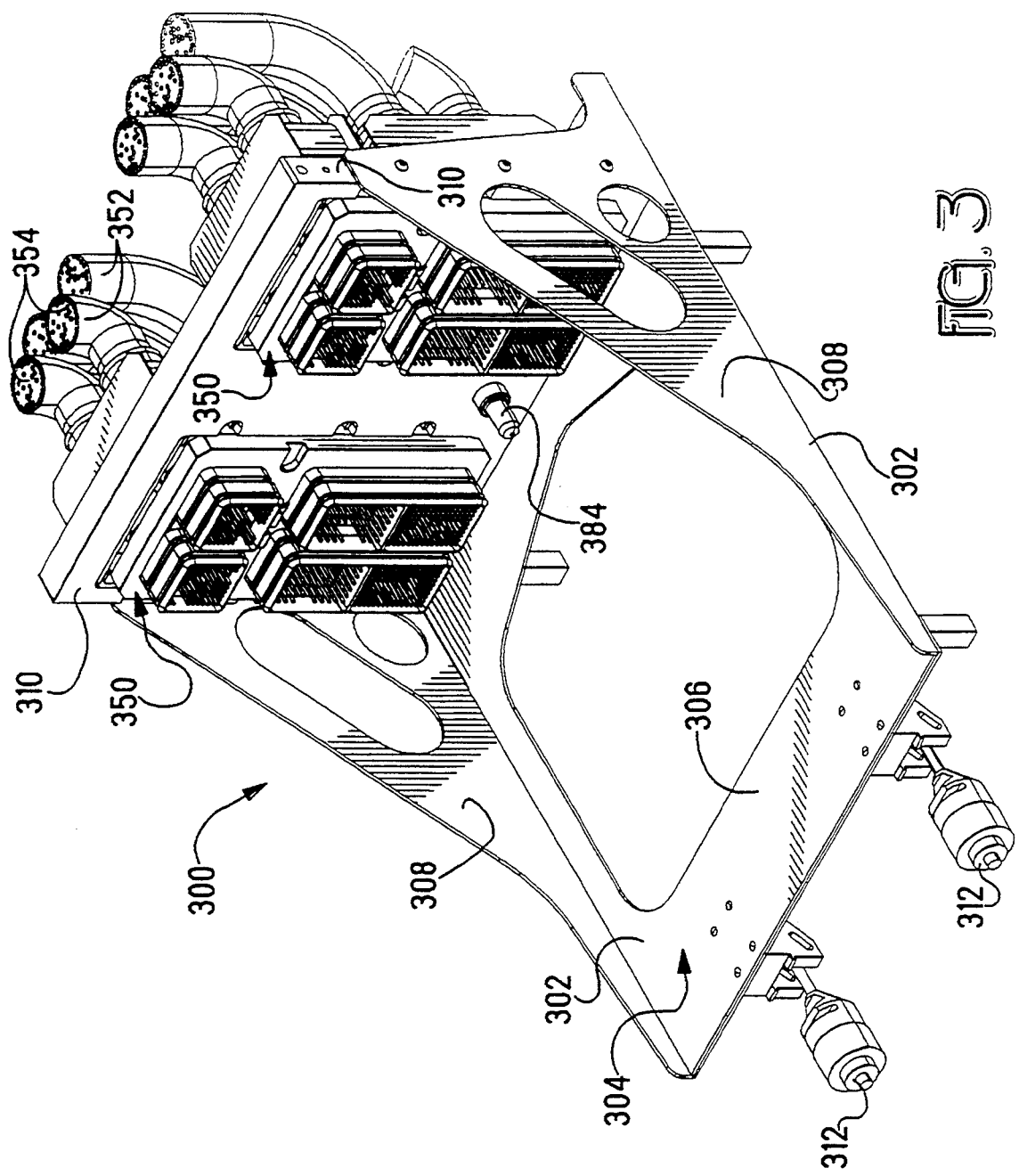
FIGS. 3 and 4 are isometric views of the rack assembly of FIG. 1, assembled and exploded respectively, showing the cable connectors mounted therein at the input/output interface of the junction box and the rack assembly.
Figure 4:
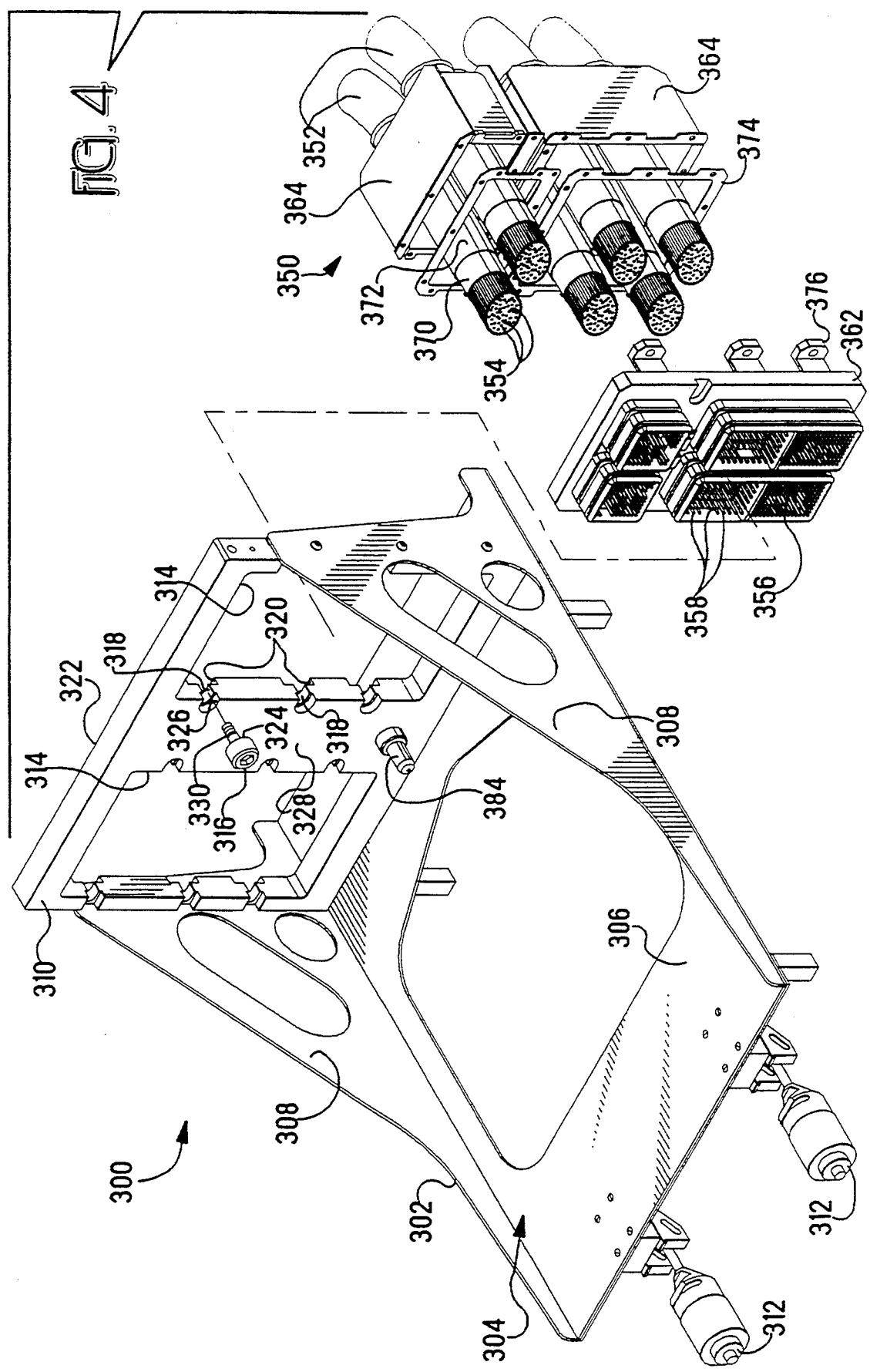
Figure 5:
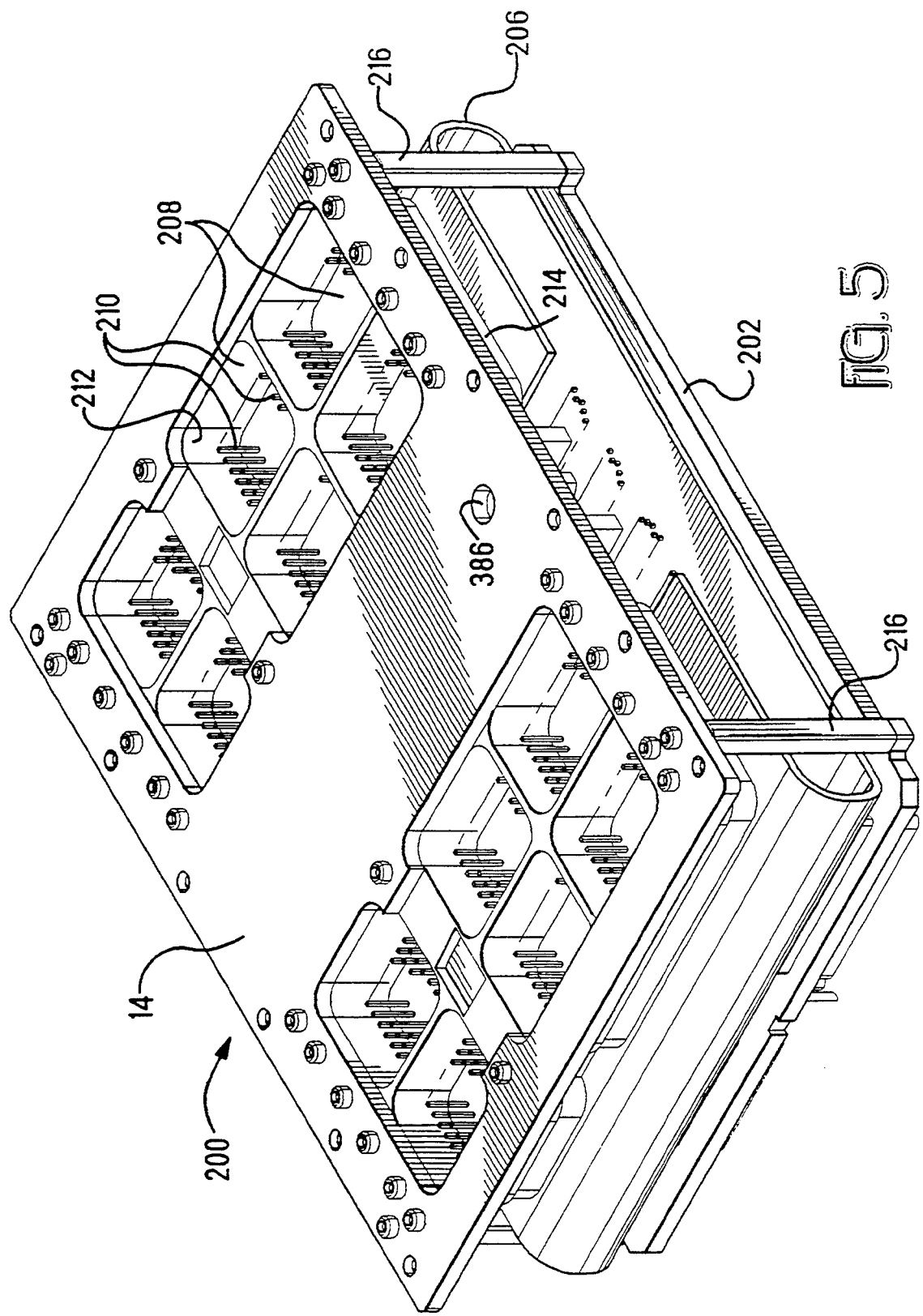
FIG. 5 is an isometric view of the rear wall of the junction box, which is part of the backplane assembly for the junction box, showing the input/output connectors thereof at the input/output interface.
Figures 8, 9:
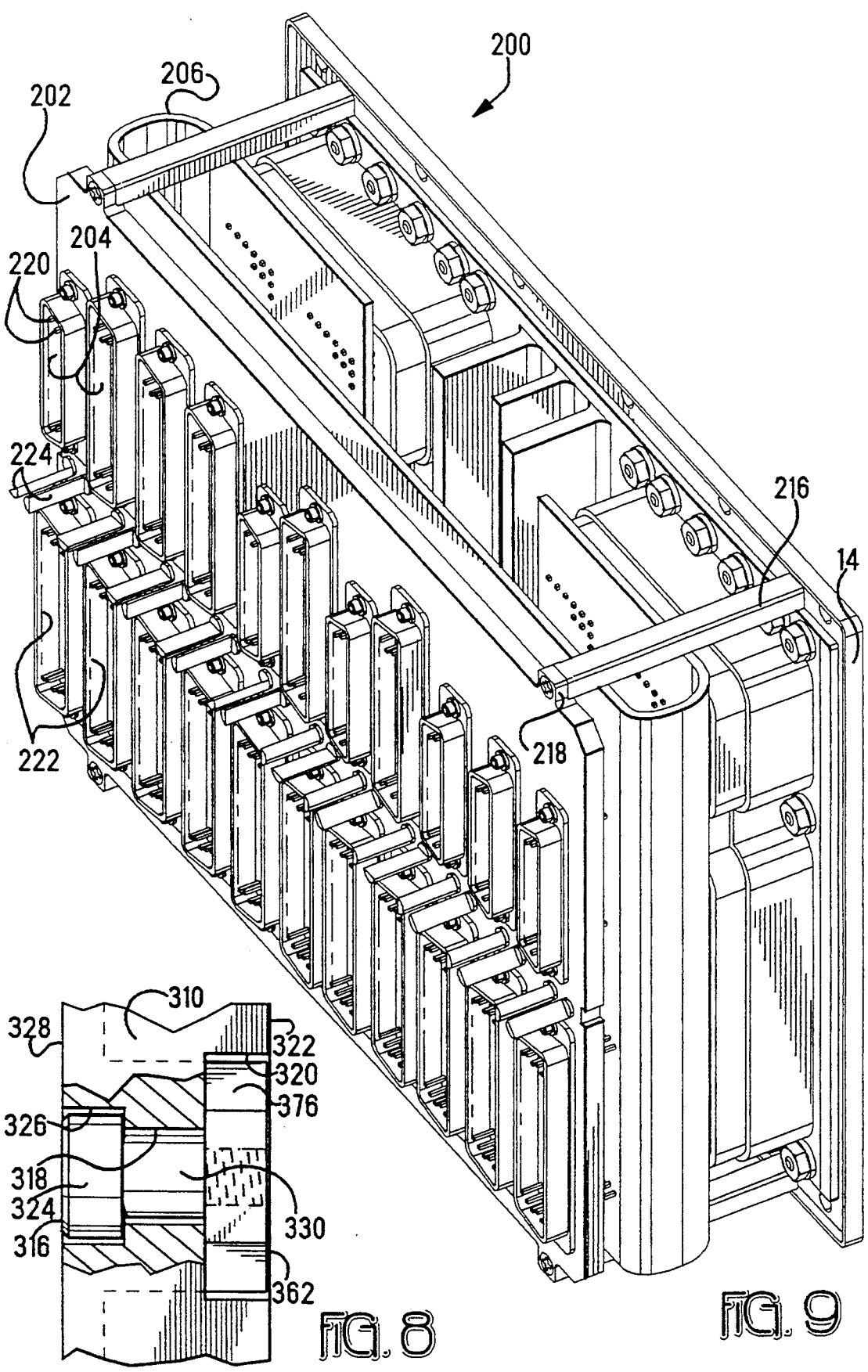
FIG. 8 is an enlarged section view of a float mount fastening arrangement of a cable connector in the frame of the rack assembly of FIGS. 3 to 7.
FIG. 9 is an isometric view of the backplane assembly showing the daughter card interface thereof within the junction box.

Junction box 10 of FIGS. 1 and 2 includes a box-like body section 12, front panel 50 and rear wall 14 with body section 12 having opposing side walls 16 and top wall 18 and bottom wall 20 and extends from front face 22 to rear face 24 defining a card-receiving region 26 extending inwardly from front face 22. Front panel 50 includes an array of exterior fins 52, to two of which are mounted a pair of handles 54 enabling manual gripping of the front panel for handling during removal from junction box 10, and is mountable to front face 22 using fasteners 56 secured about the periphery threaded into forward edges of the top and bottom walls 18,20. Junction box 10 is preferably used in conjunction with a rack assembly such as is shown in FIGS. 3 and 4 to which are secured cable-terminated connectors 350, with junction box 10 including a backplane assembly 200 such as shown in FIGS. 5 and 9 for interconnecting the cable's conductors with circuits of an array of daughter cards 100 in the junction box. Junction box 10 is disclosed in greater detail in U.S. patent application Ser. No. 0/076654 filed Jun. 11, 1993 and assigned to the assignee hereof.

In FIG. 1 junction box 10 is shown in position mounted within tray section 302 of rack assembly 300 for in-service use, with rack assembly 300 mounted on a shelf (not shown) within a structure such as an aircraft or ship. Junction box 10 is slidable along a box-receiving path 304 defined by bottom wall 306 and side walls 308, and is shown abutting panel member 310 traversing the end of box-receiving path 304. Panel member 310 is a rugged frame firmly affixed to tray section 302, and includes mounted thereto several electrical connectors 350 terminating a plurality of cables 352 containing multiple electrical conductors 354. Junction box 10 is locked in position using locking hardware 312 at the forward end of tray section 302, engaging locking embossments 28 depending from junction box 10 proximate front face 22 (FIG. 2).

Figure 14:
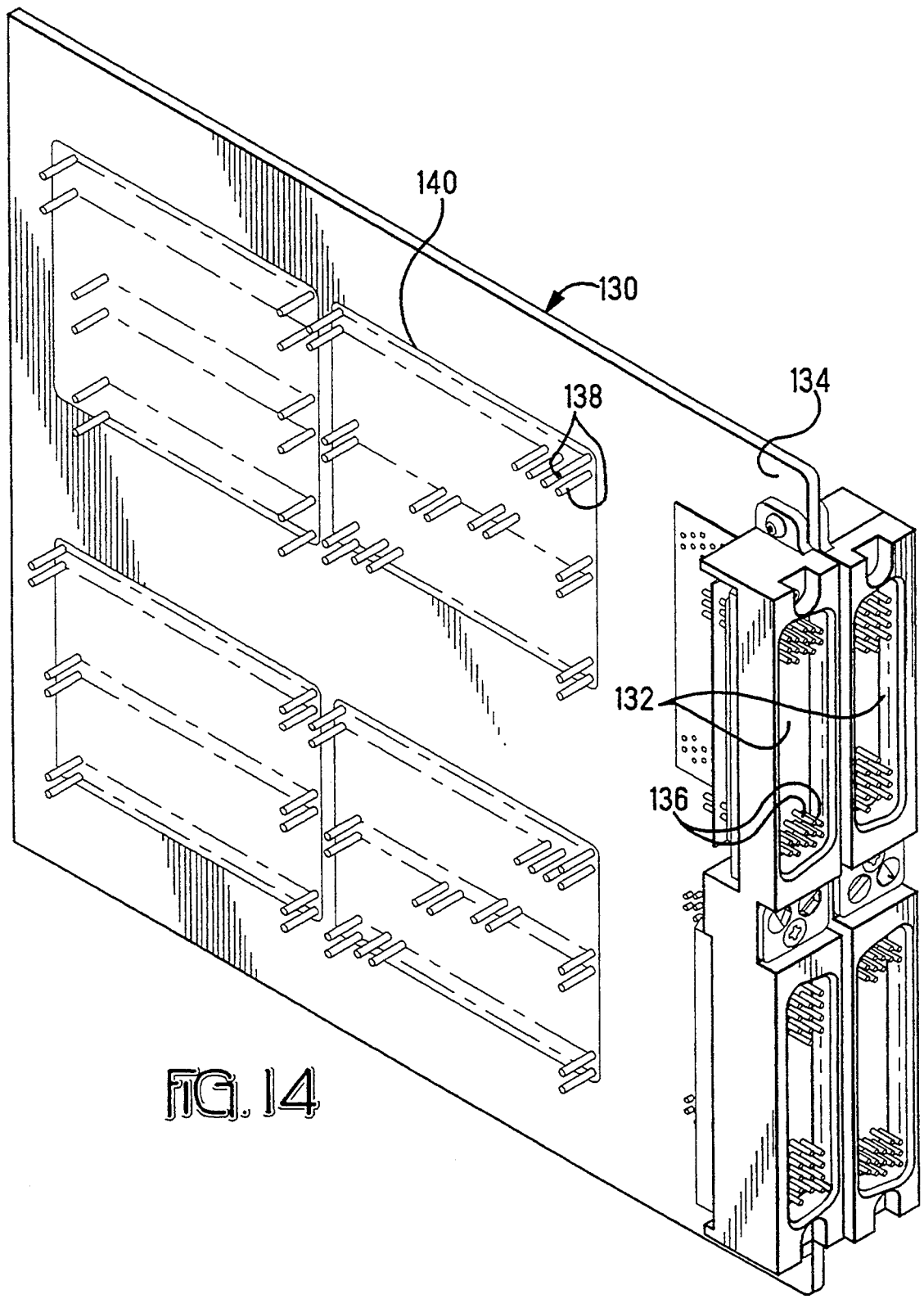
FIG. 14 is an isometric view of a matrix card for use with the backplane assembly of the junction box to integrate the circuits, and showing a pair of integral shell members containing the card-mounted connectors.

Junction box 10 is shown in greater detail in FIG. 2, with card-receiving region 26 including opposing pairs of card guide channels 30 extending inwardly from front face 22 to define guides for insertion of circuit cards such as daughter card 100 and matrix card 130. Thus junction box 10 is essentially a compact, fully enclosed card cage. Backplane assembly 200 is provided proximate rear face 24 and includes a forward wall section 202 traversing the inwardmost extent of card-receiving region 26. Mounted onto forward wall section 202 is an array of card-associated electrical connectors 204 matable with complementary connectors 102,132 affixed to leading edges 104,134 of daughter cards 100 and matrix card 130 (FIG. 14). Backplane assembly 200 further includes interconnection circuitry 206 extending from forward wall section 202 to rearward wall section 14, which may comprise the rear wall of junction box 10 as shown if desired. Rear wall 14 includes mounted thereon an array of electrical input/output connectors 208 corresponding to connectors 350 mounted on frame member 310 of rack assembly 300. Preferably rear wall 14 is joined to forward wall section 202 by a plurality of struts 216 peripherally of interconnection circuitry 206, so that backplane assembly 200 is manipulatable as a unit or subassembly insertable into body section 12 of junction box 10 at rear face 24 whereafter rear wall 14 is fastenable to rear edges of side walls 16 and top and bottom walls 18,20 thereof.

Junction box 10 defines an integral rugged electrically conductive envelope surrounding the backplane assembly and daughter cards which provides protection against electromagnetic and radiofrequency interference to assure the integrity of signals received, processed and transmitted by the electronic circuitry and components therewithin. The junction box also provides heat dissipation for the components and interconnections therewithin which have become isolated from the otherwise cooling effect of ambient air flow usually relied upon to remove thermal energy from electronics bays. Side walls 16, top and bottom walls 18,20, rear wall 14 and front panel 50 are preferably formed of an electrically conductive alloy with superior thermal conductivity such as aluminum Alloy No. 6061 suitable for welding. Further preferably, all seams between the wall members of the junction box are tight fitting with resilient EMI gaskets used where necessary such as the mounting interface of the front panel with the front face, and at the openings or cutouts 228 in rear wall 14 for input/output connectors 208 (gaskets 229 of FIG. 12), thus eliminating all gaps which otherwise could permit EMI/RFI leakage into and out of the junction box. Such gaskets could be of conductive elastomer sold as CHO-SEAL 1285 by Chromerics, Inc.

The junction box thus provides a compact card cage of robust construction adapted to shield circuit cards and interconnections of circuits thereof with input/output conductors. With use of matrix card 130 or similar element the junction box has a circuit integration capability enabling simplification of the backplane assembly to become compact for a high population of circuit interconnections.

Embossments 28 are seen depending from bottom wall 20 at the front edge thereof, and are designed to be engaged by locking hardware 312 of rack assembly 300 when junction box 10 is inserted fully into rack assembly 300. By being affixed to bottom wall 20, locking hardware 312 and embossments 28 continue holding junction box 10 in its locked in-service position mated to panel member 310 of rack assembly 300 at the input/output interface even when front panel 50 is removed from front face 22; the arrangement permits opening the junction box for insertion or removal of a particular daughter card while permitting all other daughter cards to remain in position with their circuits fully connected through the backplane assembly to the input/output conductors at the input/output interface at rear wall 14 and panel member 310 of rack assembly 300. Such capability greatly minimizes down time of an aircraft in which the junction box is mounted by rendering moot the necessity for retesting of the circuits and functions of the daughter cards not disconnected.

Further seen in FIG. 2, front panel 50 includes an array of interior fins 58 associated with respective daughter cards 100 and extending to card-proximate ends 60 on which are mounted spring clips 62. Spring clips 62 are adapted to capture trailing ends 106 of all daughter cards simultaneously upon mounting of front panel 50 in place across front face 22 in a manner permitting simultaneous disengagement, to engage trailing ends 106 at pluralities of locations to establish thermal junctions 64 therewith. Thermal junctions transfer heat from the daughter cards to the interior fins, and front panel 50 dissipates the heat from the daughter cards and interior of the junction box, especially through exterior fins 52. Rear wall 14 also is shown to have interior fins 58 which likewise provide heat dissipation benefits.

Rack assembly 300 is shown in FIGS. 3 and 4, and is of the type disclosed in U.S. patent application Ser. No. 08/076653 filed Jun. 11, 1993 and assigned to the assignee hereof. Bottom wall 306 and side walls 308 define a box-receiving path 304 extending to frame member 310, so that cable connectors 350 mounted thereon are positioned to become mated with corresponding input/output connectors 208 of the rear wall of the junction box when junction box 10 is fully installed by being moved along box-receiving path 304. The arrangement permits all cables 352 to be installed as complete cable harnesses into an aircraft (along with rack assembly) separate in time from installation of the junction box, and permitting automatic mating of the connectors merely upon junction box being installed.

Figure 6:
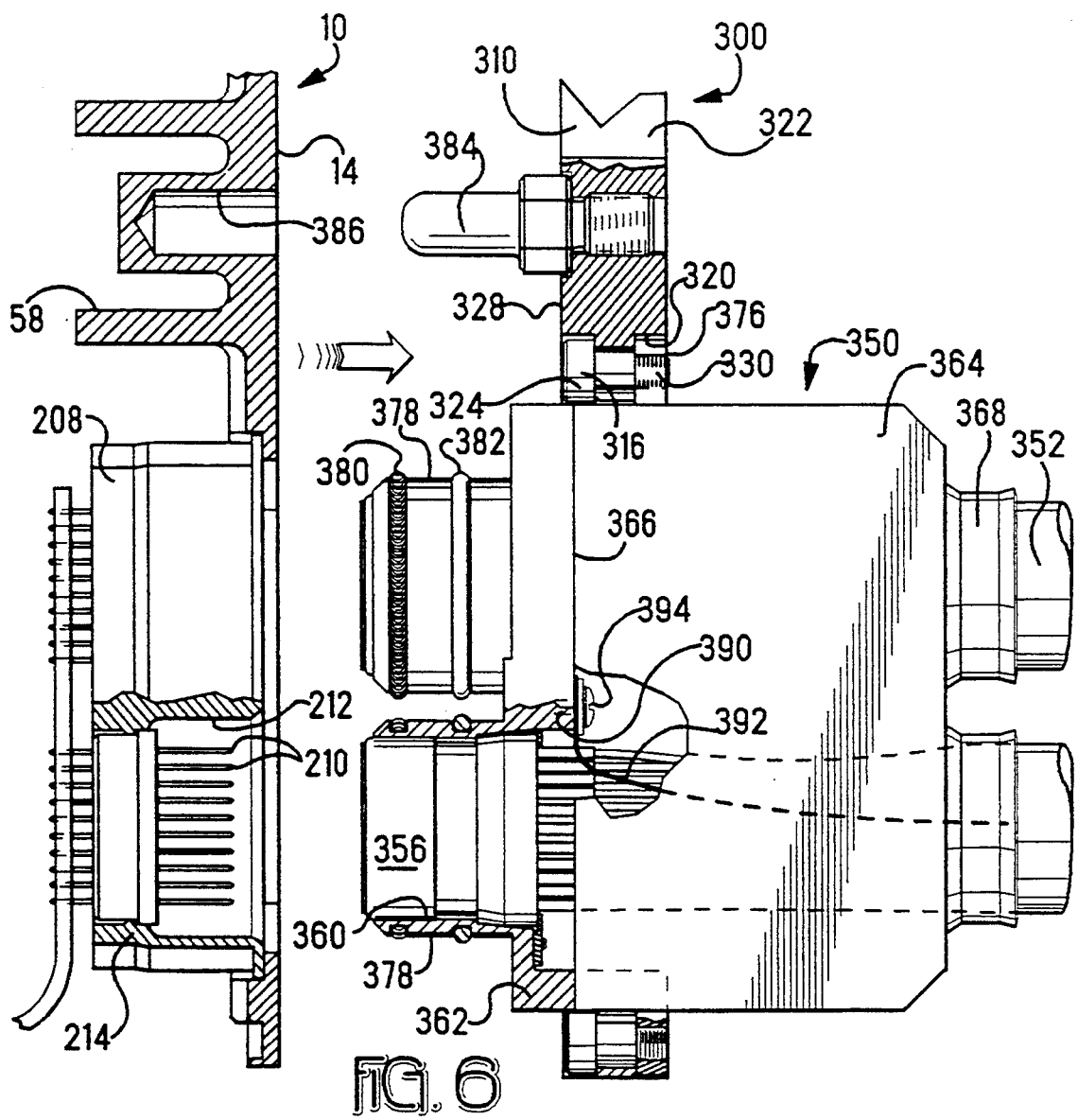
FIGS. 6 and 7 are part plan views and elevation views in cross-section of the input/output interface between the junction box and rack assembly of FIGS. 1 to 5.
Figure 7:
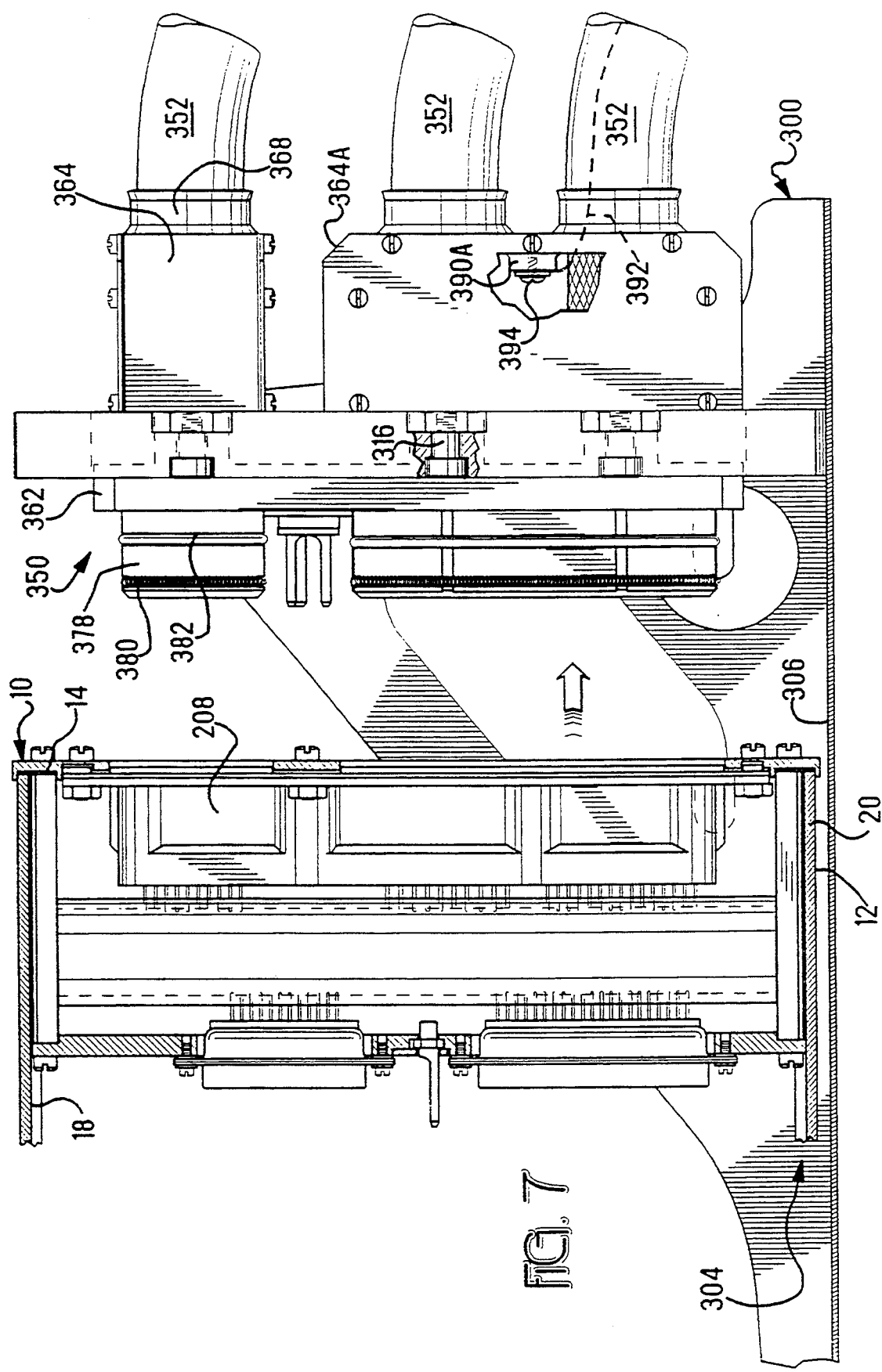

Rear wall 14 of junction box 10 is shown in FIG. 5, which is shown to be a portion of backplane assembly 200, to contain an array of input/output connectors 208 mounted therealong, simultaneously matable with cable connectors 350 on frame member 310, as illustrated in FIGS. 6 and 7. Cable connectors 350 include dielectric housings 356 containing discrete terminals terminated to conductors 354 of the cables with contact sections 358 exposed at mating faces thereof. Dielectric housings 356 are secured within cavities 360 of multiconnector shell members 362, and backshells 364 are affixed to rearward faces 366 of the shell members 362 to enclose lengths of discrete conductor wires 354 extending from each cable 352 for EMI/RFI protection, and include integral flanges 368 to which the shielding braids 370 of each cable 352 are affixed for grounding thereof; and the backshells 364 may be clamped to the cable outer insulative jackets 372 to provide strain relief for the cable connectors 350. A representative EMI gasket 374 is shown disposed between backshells 366 and shell members 362 peripherally about the cavities and along the mounting interface eliminating any gap which otherwise could permit EMI/RFI leakage therethrough to eventually pass along the conductors and into the junction box. Also, connectors 350 include a means for terminating drain wires of cables 352, such as an embossment 390 of shell 362 of FIG. 6 to which a drain wire 392 is connected by a screw 394, or an embossment 390A on the back wall of a backshell 364A by a screw 394 in FIG. 7.

With reference to FIGS. 4 and 8, each shell member 362 is mountable within a cutout 314 of the panel member 310 or frame, using fasteners 316 which extend through recesses 318 about the cutout 314 and through apertures through mounting ears 376 of shell member 362. Mounting ears 376 are received into corresponding recesses 320 along cable face 322 of frame 310, and heads 324 of fasteners 316 are received into recesses 326 permitting the fastener heads to be disposed below the forward surface 328 of frame 310, clear of interfering with abutting engagement of frame 310 and junction box rear wall 14.

With reference especially to FIG. 8, shell members 362 each include a peripheral flange extending through the corresponding cutout 314 and are dimensioned slightly smaller than the cutout; the mounting ears 376 are also slightly smaller than the recesses 320 of frame 310 into which they are received; and shanks 330 of fasteners 316 are slightly smaller than recesses 318 of the frame through which they extend. This arrangement permits the shell members to float within cutouts 314 of frame 310, enabling incremental transverse adjustment of the cable connectors 350 during blind mating with corresponding connectors along rear wall 14 of junction box 10 in order to precisely align the contact sections 358 of terminals of the cable connectors with opposed contact sections 210 of mating terminals of the connectors of the junction box. Initial engagement to incur the adjustment is established by leading edges of shrouds 378 surrounding mating faces of respective housings 356 which are received as plug sections into receptacle sections 212 of shells 214 surrounding mating faces of mating connectors 208. Circumferential EMI spring strips 380 will establish an assured ground connection between shrouds 378 and receptacle sections 212 upon mating; an O-ring 382 is shown about each shroud 378 also to assist in sealing the interface if desired.

Also seen in FIGS. 3, 4 and 6 is post member 384 affixed to frame 310 and extending forwardly into the input/output interface to be received into a complementary post-receiving hole 386 into rear wall 14 of junction box 10 upon installation of junction box 10 in rack assembly 300. Post member 384 within hole 386 serves to maintain the position of junction box 10 within rack assembly 300 after installation to absorb stresses resulting from vibration of an aircraft which otherwise could stress the mated connectors and their mated terminals during in-service use and possibly even lead to intolerable momentary signal discontinuity; the post member also provides wear resistance benefits.

Backplane assembly 200 of the present invention is illustrated more clearly in FIGS. 5 and 9. Strut members 216 extend between upper and lower edges of rearward wall section 14 and bosses 218 along upper and lower edges of forward wall section 202, thus securing forward and rearward wall sections 202,14 together. Interconnection circuitry 206 is disposed therebetween. A first connection region is defined which provides connections between circuits of the interconnection circuitry with terminals 220 of card-associated connectors 204 mounted in forward wall section 202, which mate with corresponding terminals of connectors 102,132 mounted on leading edges 104,134 of daughter cards 100 and matrix card 130 (see FIGS. 2 and 14). A second connection region is defined along rearward wall section 14 which provides connections between circuits with terminals 210 of input/output connectors 208 mounted in rearward wall section 14, which mate with contact sections 358 of corresponding terminals of cable connectors 350 mounted on panel member 310 of rack assembly 300 at the input/output interface (see FIGS. 4 and 6).

Figure 11:
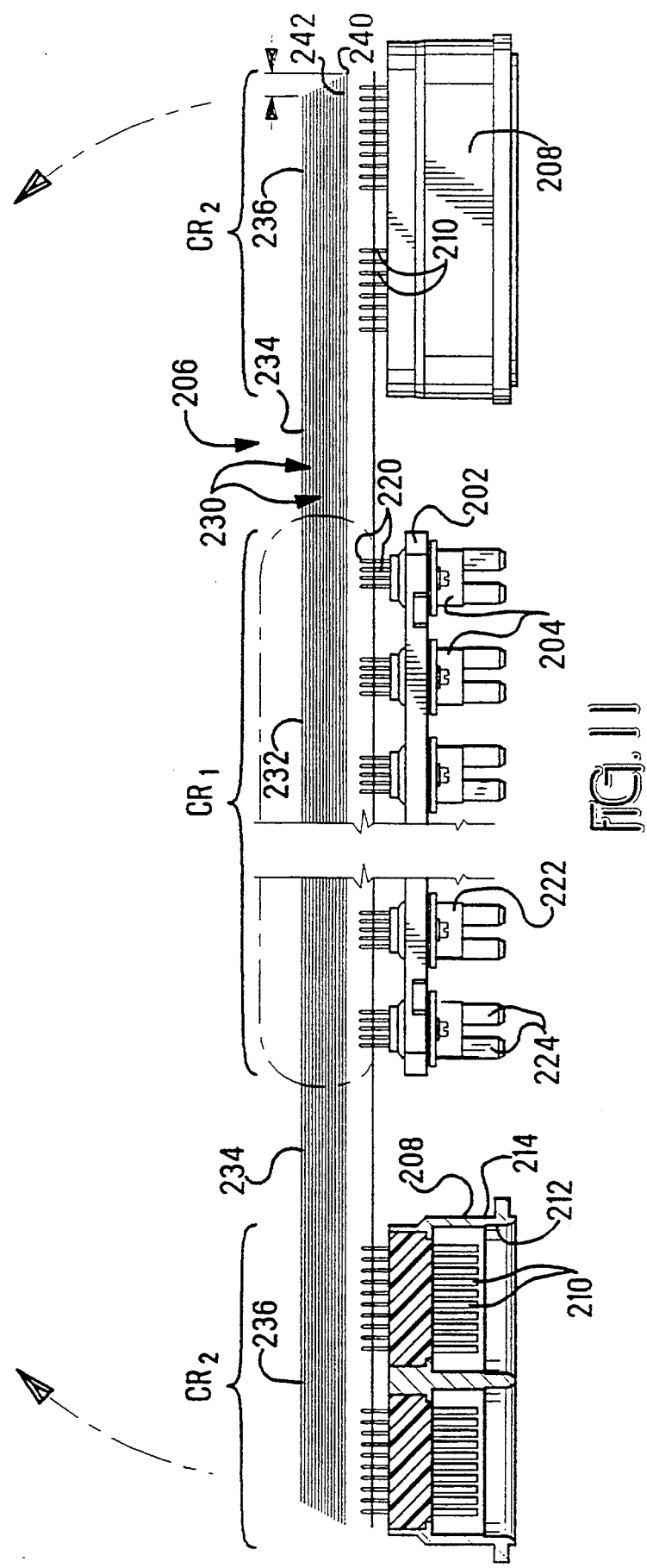
FIGS. 11 to 13 are diagrammatic illustrations of a method of constructing the backplane assembly of FIGS. 5, 9 and 10, showing discrete flexible circuit elements being sequentially assembled to the connector terminal arrays, and the forming of 180° bends in the elements resulting in the interconnection circuitry of the backplane assembly, with the rear wall being secured thereto in FIG. 13.
Figure 12:
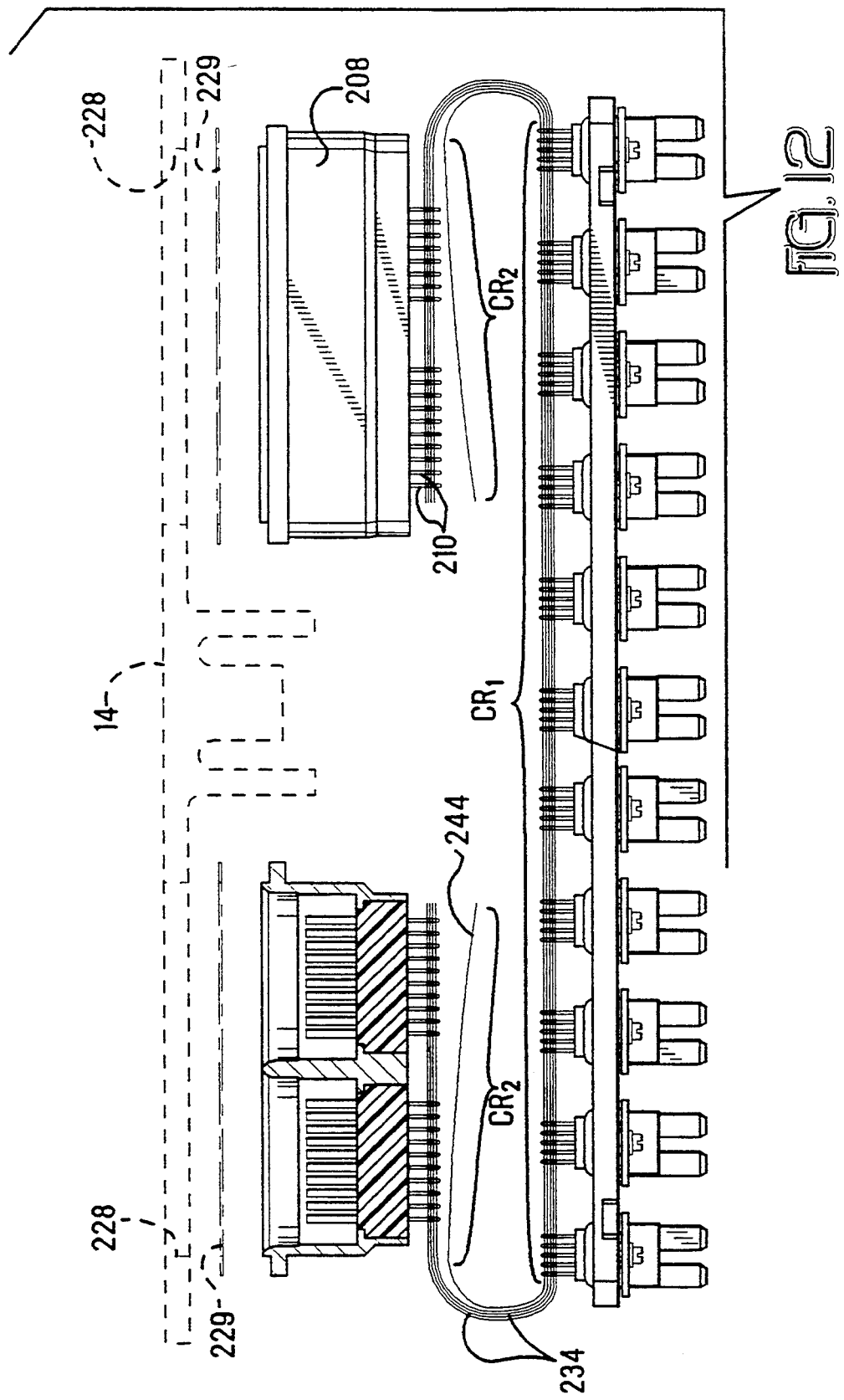
Figure 13:
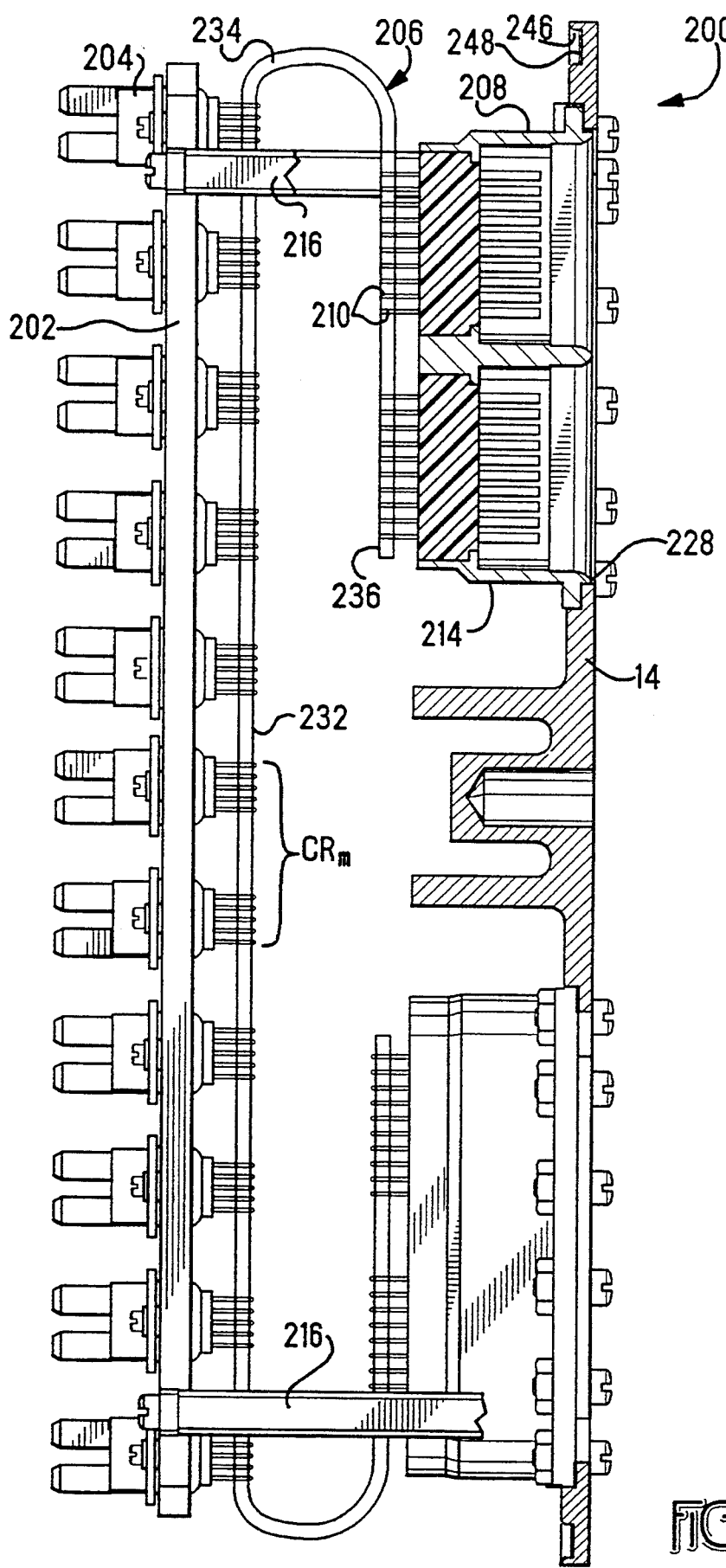

Preferably interconnection circuitry 206 is a plurality of thin film flexible circuit elements 230 overlaid to form a laminar package, as shown in FIGS. 11 to 13. The flexible circuit elements each include defined thereon certain circuits to extend from a first connection region preferably positioned in the central portion 232 of an elongate film, across intermediate film portions 234 laterally of the first connection region, to opposed end portions 236 of the elongate film, with the opposed ends together defining the second connection region. It is seen that the plurality of flexible circuit elements 230 extend through bends of 180° at the overlaid intermediate regions to each side of the backplane assembly which are within the outer envelope of the edges of the forward and rearward wall sections 202,14 to fit within body section 12 of junction box 10.

Input/output connectors 208 are disposed within shroud sections 212, which are shown to be sections of shell members 214 securable to rearward wall section 14 by an array of fasteners extending through aligned apertures of mounting flange of shell member 214 and rearward wall section 14. In FIG. 9, discrete shroud members 222 are seen fastened to forward wall section 202 to surround and protect arrays of pin contact sections of terminals 220 of card-associated connectors 204. Connector housings of connectors 204 are extended through associated cutouts of forward wall section 202 which are incrementally larger than the housings, permitting incremental transverse movement to enable precision alignment of pin contact sections of terminals 220 with complementary socket contact sections of terminals of connectors 102,132 mounted on leading edges 104,134 of daughter cards 100 and matrix card 130.

A pair of key members 224 is seen to extend forwardly of forward wall section 202 between each pair of connectors 204 associated with each daughter card 100, for engagement with complementary key members of the daughter card connectors 102 which enables mating of the desired daughter card with the connectors at that location. Only when the associated key members at a particular daughter card location are intentionally physically positioned to be oriented to complement each other, do the card-mounted connectors 102 and the wall-mounted connectors 204 mate; otherwise such key members abut prior to connector mating because the key members are not oriented to complement each other, preventing mating of an undesired daughter card at that card location.

Figure 10:
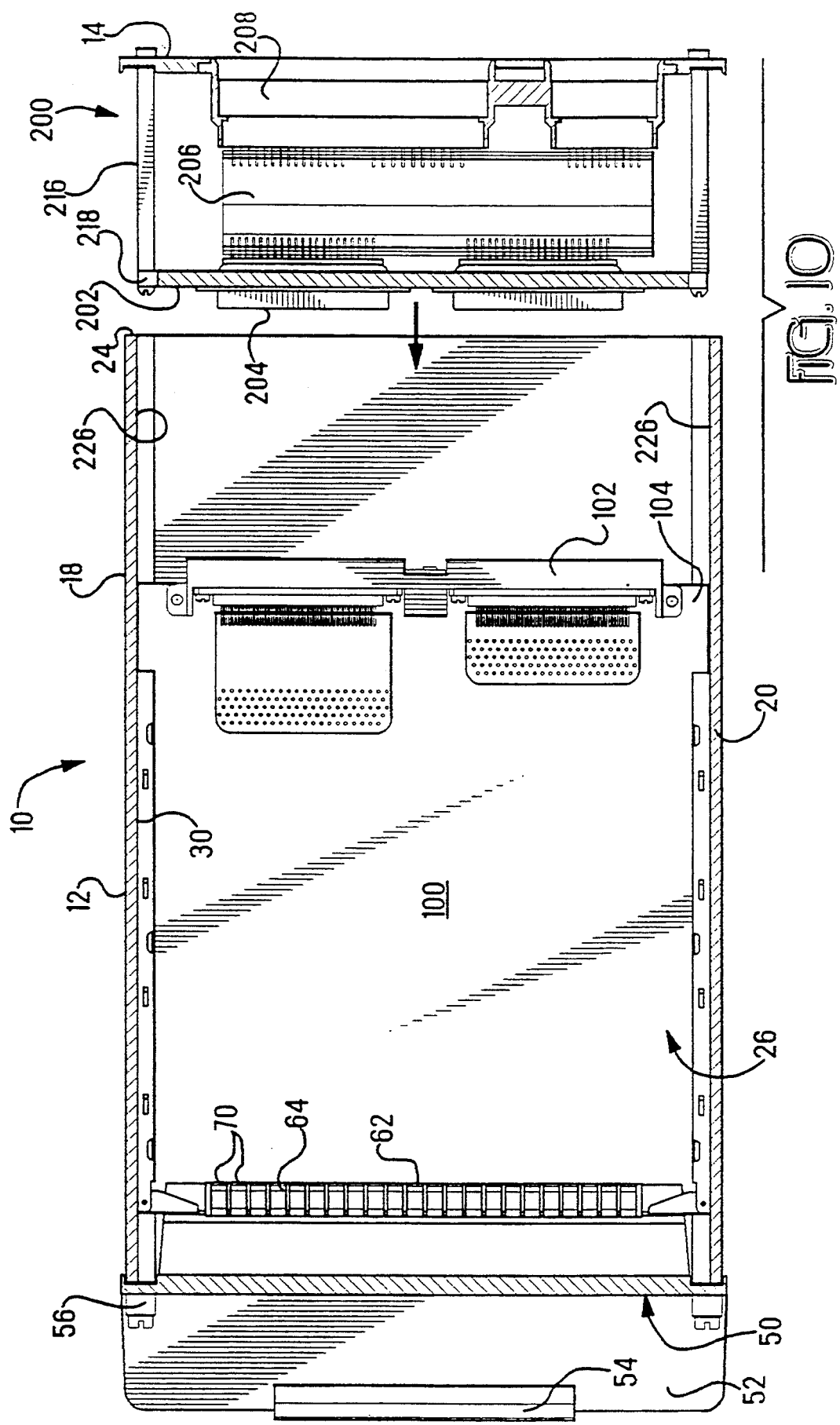
FIG. 10 is a longitudinal section view illustrating the mounting of the backplane assembly of FIGS. 5 and 9 into the junction box of FIGS. 1 and 2 which contains a daughter card positioned therewithin, and the front panel secured in place at the front face of the junction box.

With reference now to FIG. 10, backplane assembly 200 is shown positioned to be inserted into rear face 24 of junction box 10. Forward wall section 202 is dimensioned and shaped so that the peripheral edge thereof just fits within the inner surfaces of top and bottom walls 18,20 (and opposed side walls 16) of body section 12. Rearward wall section 14 is shaped and dimensioned so that its periphery abuts the rear edges of the four sides of body section 12, for fasteners to secure it to the rear face 24 of the junction box 10. Struts 216 extend between the periphery of rearward wall section 14 and the tabs 218 of forward wall section 202, are received into pairs of channels 226 in top and bottom walls 18,20 of the junction box 10 extending inwardly from rear face 24, which positions forward wall section 202 laterally for connectors 204 mounted thereto to be aligned with card guides 30 of the card-receiving region 26 forwardly thereof, all so that the wall-mounted connectors 204 are aligned with card-mounted connectors 102,132 upon insertion of the associated daughter card or the matrix card.

FIGS. 11 to 13 are diagrams illustrative of the process of assembling flexible circuit elements 230 to define backplane assembly 200. In FIG. 11 a first element 240 is shown disposed above forward wall section 202 in which connectors 204 are mounted, with pin contact sections of terminals 220 extending upwardly in arrays, all in the first connecting region $CR_1$ of the element. Laterally of the first connecting region are input/output connectors 208 initially arranged coplanar with connectors 204, likewise with pin contact sections of their terminals extending upwardly in arrays, together both input/output connector terminal arrays comprising second connecting region $CR_2$. Pin-receiving holes extend through first element 240 to receive all terminals therethrough in regions $CR_1$ and $CR_2$. First element 240 includes selected circuits defined thereon, each having a terminus adjoining the pin-receiving hole at each terminal for which the particular circuit is intended to connect between regions $CR_1$ and $CR_2$, and the terminals at those termini may now be soldered. Thereafter a second flexible circuit element 242 may now be positioned to overlie first element 240, and again having a complete array of pin-receiving holes through its connection regions $CR_1$ and $CR_2$, and the termini of its selected circuits soldered to the terminals thereat. The steps are repeated for each successive flexible circuit element.

It is preferred that each flexible circuit element 230 be slightly less long than the immediately preceding element in forming the laminar array, and the opposed intermediate sections 234 are less in length. Thus the pair of connection sections comprising second region $CR_2$ of the second element 242 are staggered inwardly from the corresponding connecting sections of the first element 240, so that the pin-receiving hole arrays are staggered inwardly. With such arrangement the terminals of connectors 208, when inserted through the pin-receiving holes of the second element 242, cause the first flexible circuit element 240 to bend slightly upwardly, initiating the bends at intermediate sections.

Upon placement of the final flexible circuit element in position, as in FIG. 12, the laminar assembly is formed around bends of 180° at the overlying intermediate sections 234 of the flexible circuit elements. In FIG. 13, the rearward wall section 14 is affixed by fastening thereto in corresponding cutouts 228, shell members 214 in which input/output connectors 208 are already secured, and then securing struts 216 between rearward wall section 14 and forward wall section 202. Also, rear wall 14 is seen to have a peripheral groove 246 therearound within which is preferably secured a resilient conductive EMI gasket 248 which will abut the rear edges of the side walls 16, top wall 18 and bottom wall 20 of body section 12 of junction box 10 upon assembly of rear wall 14 thereto.

An alternative method for assembling the flexible circuit elements can comprise stacking all elements together with pin-receiving holes in their first connecting regions $CR_1$ all aligned, and then clamping or joining all the elements together along the periphery of first connection region $CR_1$. Thereafter plating material is deposited along all the aligned pin-receiving holes of the first region, which makes an electrical connection only with circuits of any of the elements having termini adjoining the respective holes. Such plating may be performed similar to the process used in fabricating conventional printed circuit boards. Thereafter upon insertion of all pin contact sections of connectors through all the pin-receiving holes, the terminals are all soldered simultaneously to the plating material atop the last flexible circuit element, shown disposed along the top of the laminar array. The forming of the terminations in the second connection region may proceed as in the first described method, or may be similarly performed after the bends are formed and the end sections of all of the elements secured together with their pin-receiving holes aligned and then plated, after which the terminals of connectors may be soldered to the plating material.

The junction box 10 of the present invention, and the backplane assembly 200 used therewith, also are especially useful to define a wire integration system, in which circuits of the daughter cards 100 can be connected as desired to any particular conductor of the input/output interface. Matrix card 130 is disclosed to be insertable into the junction box in the same manner as a daughter card at a particular location, preferably having connectors 132 mounted on both sides of leading edge 134 as shown in FIG. 14. Terminals 136 of the four connectors include contact sections electrically connected to circuits of the matrix card which extend to one or more other card terminals 138 which in turns are connected to other card terminals 138 or directly to other terminals 136 of the four connectors as desired, such as by using flexible film circuit elements 140 as shown, or alternatively by discrete wires wrapped to the card terminals 138 with conventional wire wrapping techniques. The matrix card can thus be easily programmed by utilizing flexible circuits of particular customized circuit design (or discrete wire wrap segments), which can be replaced on the matrix card if necessary.

Backplane assembly 200 accommodates the use of such a programmable circuit integration member as matrix card 130, by directing substantially all circuits of the various flexible circuit elements of the laminar array from input/output terminals 210 of second connection region $CR_2$ (FIG. 12) only to terminals in matrix connection region $CR_M$ (FIG. 13) preferably in the center of first connection region $CR_1$ with which the location of matrix card 130 would of course be aligned. From matrix connection region $CR_M$ circuit segments would extend to selected terminals of first connection region $CR_1$ associated with particular daughter cards. Thus backplane assembly 200 may be fabricated to a basic circuit configuration, with matrix card 130 providing customization for particular uses of the junction box 10, and enabling ease of reprogramming, all resulting in simplified construction of the backplane assembly which can easily handle providing circuits for over a thousand of individual terminal interconnections in a compact arrangement, as in the present design.

The backplane assembly of the present invention may be used with card cage arrangements than the junction box with the backplane assembly is disclosed herein to be especially useful. Variations and modifications may occur to the backplane assembly of the embodiment disclosed herein, which may occur to the artisan, which are within the spirit of the invention and the scope of the claims.

What is claimed is:

1. A backplane assembly for a card cage for a plurality of electrical interconnections of circuits of circuit cards with electrical conductors extending into the card cage at an input/output interface, the circuit cards being receivable into a card-receiving region of the card cage along pairs of card guides extending through the card-receiving region from a card-receiving opening of the card cage, the input/output interface including an array of electrical input/output connectors, the backplane assembly positioned between the card-receiving region and the input/output interface and comprising:

a forward wall member dimensioned to traverse the rearward end of the card-receiving region within the card cage and including an array of card connectors mounted thereon to mate with corresponding connectors of a plurality of circuit cards, with said card connectors so positioned with respect to respective said pairs of card guides to mate with complementary connectors along leading ends of respective said circuit cards during card insertion;

a rearward wall section at least supporting said array of input/output connectors thereon and joined to said forward wall section by a plurality of struts being affixable proximate peripheral edges of said forward and rearward wall sections and spacing them a selected distance apart; and interconnection circuitry disposed between said forward and rearward wall sections defining an array of circuits, with said interconnection circuitry affixed therebetween to define a subassembly manipulatable as a unit during card cage assembly, said card connectors each containing an array of first terminals extending from outer contact sections exposed to be mated with terminals of said connectors of said circuit cards to pin-shaped first inner contact sections connected with corresponding circuits of said interconnection circuitry at connection arrays of a first region, and said input/output connectors each containing an array of second terminals therein extending from outer contact sections exposed to be connected with external input/output conductors to pin-shaped second inner contact sections connected to respective circuits of said interconnection circuitry at connection arrays of a second region;

said interconnection circuitry being defined by a plurality of flexible circuit elements adjacent one another, each said flexible circuit element including pin-receiving holes for all first inner contact sections in a first portion thereof and including pin-receiving holes for all second inner contact sections in a second portion thereof, with all said first and second inner contact sections extending through said pin-receiving holes of all said flexible circuit elements aligned therewith;

each said flexible circuit element at least including selected circuits defined thereon extending from termini at selected pin-receiving holes of said first portion to termini at selected pin-receiving holes of said second portion, whereby selected said pin-shaped first and second inner contact sections extending through said selected pin-receiving holes are electrically connected to said selected circuits upon soldering, and others of said pin-shaped first and second inner contact sections remain isolated from said selected circuits, and whereby all said first and second inner contact sections are terminated to associated circuits on said flexible circuit members, whereby many said first terminals of said card connectors are electrically connected to corresponding second terminals of said input/output connectors by discrete circuits in a compact interconnection arrangement having high circuit density and with said first terminals and corresponding second terminals free of any need to be physically aligned with each other.

2. A backplane assembly as set forth in claim 1 wherein said forward wall section includes cutouts therethrough associated with each said card connector, with each said cutout being slightly larger than the outer dimension of the respective said card connector enabling each card connector to become incrementally adjusted laterally to selfalign with a mating connector on the leading edge of a said circuit card during card insertion, to precisely align said outer contact sections of said first terminals with complementary terminals of said mating connector during mating.

3. A backplane assembly as set forth in claim 1 wherein said rearward wall section is adapted to be mounted to a rear face of the card cage to define a rear wall thereof, thereby simplifying the assembly of the backplane assembly within the card cage.

4. A backplane assembly as set forth in claim 1 wherein each said flexible circuit element is elongate and includes all said pin-receiving holes for said first interconnection region in a central portion, and half said pin-receiving holes for said second interconnection region on each of two end portions laterally of said central portion and joined thereto by respective intermediate portions, and said intermediate portions are formed around gradual 180° bends to position said respective end portions proximate each other and parallel to said central portion and spaced therefrom, with each said flexible circuit element having intermediate portions of incrementally less length between said central and end portions thereof, proceeding from an outermost one of said flexible circuit elements to an innermost one thereof enabling said pin-receiving holes of said second regions to be alignable.

5. The backplane assembly of claim 1 wherein said flexible circuit elements are securely affixed tightly together at least adjacent said first regions thereof in a manner maintaining the alignment of said pin-receiving holes, and plating material is disposed through all said pin-receiving holes of said flexible circuit elements, the plating material of any hole becoming electrically connected with only those circuits having termini surrounding the particular hole, and upon insertion of said pin-shaped first inner contact sections extending through respective aligned pin-receiving holes enabling soldering of ends thereof simultaneously to said plating material of said respective holes to define the electrical connection to associated said circuits.

6. A backplane assembly as set forth in claim 1 wherein substantially all said selected circuits of all said flexible circuit elements extend from termini in said second regions to termini in a selected matrix area of said first region, and additional circuits extend from termini in said selected matrix area of said first region to termini in daughter card areas of said first region, enabling use of a programmable circuit integration member for selectively connecting substantially all said circuits of said interconnection circuitry extending to said second terminals of said input/output connectors with substantially all said circuits extending to said first terminals of said card connectors, upon said integration member being electrically connected with said backplane assembly, thereby simplifying the routing of circuitry of the backplane assembly while permitting programming thereof to change the routing if desired.

7. A backplane assembly as set forth in claim 6 wherein said integration member is a circuit card insertable into said card cage along a said pair of card guides from said card-receiving opening, to a selected array of card connectors of said backplane assembly with first terminals of said selected array connected with said circuits extending to said second terminals of said input/output connectors and connected to said circuits extend to said first terminals of remaining ones of said card connectors.

* * * * *